(12) United States Patent
Xu et al.

(10) Patent No.: US 8,786,032 B2
(45) Date of Patent: Jul. 22, 2014

(54) P-TYPE SEMICONDUCTOR DEVICE AND METHOD FOR MANUFACTURING THE SAME

(75) Inventors: Gaobo Xu, Beijing (CN); Qiuxia Xu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/125,710

(22) PCT Filed: Feb. 27, 2011

(86) PCT No.: PCT/CN2011/071353
§ 371 (c)(1),
(2), (4) Date: Apr. 22, 2011

(87) PCT Pub. No.: WO2012/006880
PCT Pub. Date: Jan. 19, 2012

(65) Prior Publication Data
US 2013/0099328 A1 Apr. 25, 2013

(30) Foreign Application Priority Data
Jul. 16, 2010 (CN) .......................... 2010 1 0233549

(51) Int. Cl.
*H01L 29/78* (2006.01)
*H01L 23/58* (2006.01)
(52) U.S. Cl.
USPC .... 257/411; 257/635; 257/369; 257/E21.369; 257/E27.062; 438/303; 438/216
(58) Field of Classification Search
USPC ......................................... 257/411, 369, 635
See application file for complete search history.

(56) References Cited

U.S. PATENT DOCUMENTS

| 2005/0062136 A1* | 3/2005 | Senzaki ..................... 257/635 |
| 2009/0283838 A1* | 11/2009 | Park et al. .................. 257/369 |
| 2009/0315124 A1 | 12/2009 | Chen et al. |
| 2010/0065927 A1* | 3/2010 | Akiyama et al. ............. 257/411 |
| 2010/0133623 A1* | 6/2010 | Inumiya et al. .............. 257/369 |

FOREIGN PATENT DOCUMENTS

CN          1598026 A          3/2005

OTHER PUBLICATIONS

Xu et al., "Influence of Different Interlayers on Properties of MOS with HfTaON Gate Dielectric", Research and Progress of SSE, vol. 29, No. 4, Dec. 2009, pp. 593-596.
Notification of Transmittal of Translation of the International Preliminary Report on Patentability for Application No. PCT/CN2011/071353, dated Jan. 31, 2013.

* cited by examiner

*Primary Examiner* — Marcos D. Pizarro
*Assistant Examiner* — Quinton Brasfield
(74) *Attorney, Agent, or Firm* — Finnegan, Henderson, Farabow, Garrett & Dunner, LLP (57) ABSTRACT

The present application provides a p-type semiconductor device and a method for manufacturing the same. The structure of the device comprises: a semiconductor substrate; a channel region positioned in the semiconductor substrate; a gate stack which is positioned on the channel region comprising a gate dielectric layer and a gate electrode, wherein the gate dielectric layer is positioned on the channel region and the gate electrode is positioned on the gate dielectric layer; and source/drain regions positioned at the two sides of the channel region and embedded into the semiconductor substrate; wherein the element Al is distributed in at least one of the upper surface, the bottom surface of the gate dielectric layer and the bottom surface of the gate electrode. The embodiments of the present invention are applicable for manufacturing MOSFET.

13 Claims, 5 Drawing Sheets

P-TYPE SEMICONDUCTOR DEVICE AND METHOD FOR MANUFACTURING THE SAME

CROSS REFERENCE TO RELATED APPLICATIONS

This application is a national phase application based on PCT/CN2011/071353, filed Feb. 27, 2011, which claims the priority of Chinese Patent Application No. 201010233549.7, filed Jul. 16, 2010, the content of both of which is incorporated herein by reference.

FIELD OF THE INVENTION

The present invention relates to a semiconductor device and a method for manufacturing the same, particularly, relates to a high k gate dielectric/metal gate semiconductor device and a method for manufacturing the same, which is helpful for tuning work function of a p-type metal gate by way of introducing Al into the upper and bottom interfaces of the high k gate dielectrics and the bottom surface of the metal gate electrode.

BACKGROUND OF THE INVENTION

In the past four decades, the integrated circuit technology is continually developed in accordance with Moore's law, the critical dimension is scaling, the integrated level is continually improving, and the function becomes more and more powerful. Nowadays, the critical dimension of metal oxide semiconductor field effect transistors (MOSFET) comes into sub 50 nm. However, with the scaling in critical dimension, the use of traditional gate stacks formed with silicon oxide gate dielectrics/polysilicon would result in an exponential abrupt rise in leakage current at the gate dielectrics, the depletion effect of polysilicon becomes increasingly grave, and the resistance of the polysilicon gate also increases accordingly. To overcome the abovementioned problems, the industry begins to use the novel gate stack structure, which is formed by high k gate dielectrics and metal gate electrode, to replace the traditional gate stack. With a same equivalent oxide thickness, the high k gate dielectrics have a greater physical thickness such that it is able to effectively reduce the leakage current at the gate dielectrics; besides, the metal gate electrode is able to fundamentally get rid of polysilicon depletion effect.

In order to obtain an appropriate threshold voltage, the work function of the metal gate material for pMOSFET is usually required to be in proximity of 5.2 eV. However, the single element metal material with such a high work function has very stable chemical properties, and thus is hard to etch and also is very expensive, for example, platinum, gold, etc. Therefore, it is not practical to tune the work function of a p-type device with such kind of metal materials.

Accordingly, there is a need to propose a novel p-type semiconductor device and a method for manufacturing the same, so as to effectively tune the work function of pMOSFET and to improve the performance of the devices.

SUMMARY OF THE INVENTION

In order to solve the aforesaid technical problems, the present invention provides a novel p-type semiconductor device and a method for manufacturing the same, which is capable of effectively tuning the work function of pMOSFET and improving the performance of the device.

In one aspect, the present invention provides a semiconductor device, which comprises: a semiconductor substrate; a channel region positioned in the semiconductor substrate; a gate stack, which is positioned on the channel region, comprising a gate dielectric layer and a gate electrode layer, wherein the gate dielectric layer is positioned on the channel region, and the gate electrode is positioned on the gate dielectric layer; source/drain regions positioned at the two sides of the channel region and embedded into the semiconductor substrate; wherein, the element Al is distributed in at least one of the upper surface, the bottom surface of the gate dielectric layer and the bottom surface of the gate electrode layer.

Preferably, the element Al combines with O to form Al—O electric dipoles.

Optionally, the gate dielectric layer comprises a high k gate dielectric layer containing Al; alternatively, the gate dielectric layer may comprise a first dielectric layer and a second dielectric layer, wherein the first dielectric layer is a high k gate dielectric layer, and the second dielectric layer is an oxide or nitride layer that contains Al, with a thickness of 2-15 Å, and is positioned on at least one of the top face and the bottom face of the first dielectric layer.

In the foregoing solution, the high k gate dielectric layer comprises: any one or a combination of several of HfAlON, HfSiAlON, HfTaAlON, HfTiAlON, HfON, HfSiON, HfTaON, HfTiON.

Optionally, the gate electrode layer comprises a first metal layer; the first metal layer is a metal nitride layer containing Al, for example, it may comprise: any one or a combination of several of TaAlN, TiAlN, MoAlN, AlN.

Optionally, the gate electrode layer further comprises a second metal layer positioned on the first metal layer; the second metal layer may comprise a metal nitride, for example, any one or a combination of several of TaN, TiN, MoN. Alternatively, the second metal layer also may comprise Mo, W or their combination.

Preferably, an oxide layer is further incorporated between the gate dielectric layer and the semiconductor substrate; and the oxide layer is favorable for forming Al—O electric dipoles at the bottom surface of the gate dielectric layer.

In another aspect, the present invention provides a method for manufacturing a semiconductor device, which comprises: providing a semiconductor substrate; forming a gate stack on the semiconductor substrate, wherein the gate stack comprises a gate dielectric layer and a gate electrode layer, and wherein the gate dielectric layer is formed on a channel region, and the gate electrode layer is formed on the gate dielectric layer; forming sidewall spacers at the two sides of the gate stack; and embedding the semiconductor substrate at the two sides of the gate stack to form source/drain regions. Wherein, the element Al is distributed in at least one of the upper surface, the bottom surface of the gate dielectric layer and the bottom surface of the gate electrode layer.

Preferably, the step of forming a gate stack on a semiconductor substrate comprises: forming a gate dielectric layer on the semiconductor substrate; forming a gate electrode layer on the gate dielectric layer; and performing patterned etching to the gate electrode and the gate dielectric layer to form a gate stack.

Wherein, the step of forming a gate dielectric layer on the semiconductor substrate may comprise: subsequently forming on the semiconductor substrate a gate dielectric layer that comprises a first dielectric layer and a second dielectric layer(s); performing thermal annealing to the gate dielectric layer in Nitrogen mixed with Oxygen, wherein the oxygen content in the Nitrogen-Oxygen mixture is 1%-10%. Wherein, the first dielectric layer is a high k gate dielectric layer; the second dielectric layer(s) is(are) an oxide or nitride layer containing Al and is(are) positioned above or under the first dielectric layer, or the both. After the performance of thermal annealing, Al in the gate dielectric layer combines with O to form Al—O electric dipoles.

Preferably, the step of forming a gate electrode layer on a gate dielectric layer comprises: forming a first metal layer on the gate dielectric layer, wherein the first metal layer is a metal nitride layer containing Al; and forming a second metal layer on the first metal layer.

Wherein, the second metal layer may comprise a metal nitride, or may further comprise Mo, W or their combination.

Preferably, prior to the formation of a gate stack, the method further comprises: forming an oxide layer on a semiconductor substrate.

Preferably, after the formation of source/drain regions, the method further comprises: performing thermal annealing to the gate electrode layer so as to enable the element Al in the gate stack to form Al—O electric dipoles.

The present invention proposes such a semiconductor structure and method for manufacturing the same that, ascribing to the introduction of the element Al, it is able to form electric dipoles at the interface of the gate dielectric layer and the gate electrode, and at the interface between the gate dielectric layer and the semiconductor substrate with the performance of thermal annealing, which accordingly cause change to the energy level at the interfaces, so that the flat-band voltage of the metal gate shifts forward, which is favorable for tuning work function of PMOS metal gate.

BRIEF DESCRIPTION OF THE DRAWINGS

The foregoing and other objects, characteristics and advantages of the present invention are made more evident with perusal of the following detailed description of exemplary embodiments with reference to the accompanying drawings, in which.

Specification of the reference signs:

1000, semiconductor substrate; 1002, channel region; 1004, second dielectric layer; 1006, first gate dielectric layer; 1008, second dielectric layer; 1010, first metal layer; 1012, second metal layer; 1014, polysilicon; 1016, sidewall spacer; 1018, source/drain regions; 1020, metal silicide; 1022, shallow trench isolation; 102, gate dielectric layer; 104, gate electrode layer.

DETAILED DESCRIPTION OF THE INVENTION

The present invention is described here below with the specific exemplary embodiments illustrated in the accompanying drawings, but it should be understood that these descriptions are only illustrative and should not be interpreted as a limit to the present invention. Besides, in the following disclosure, the publicly known structures and technologies are not described in order not to obscure the concept of the present invention.

The drawings illustrate diagrams of the layer structures according to the embodiments of the present invention. However, these Figures are not drawn to scale; for clarity's sake, some details therein are enlarged and some details may be omitted. The shapes of the various regions and layers shown in the Figures and their relative sizes, positional relationships are merely illustrative, thus, in practice, there may be deviation arising from manufacturing tolerance or technical restriction. Besides, according to the needs in practice, a person of ordinary skill in the art may additionally design regions/layers in different shapes, sizes and relative positions.

Figure 1:
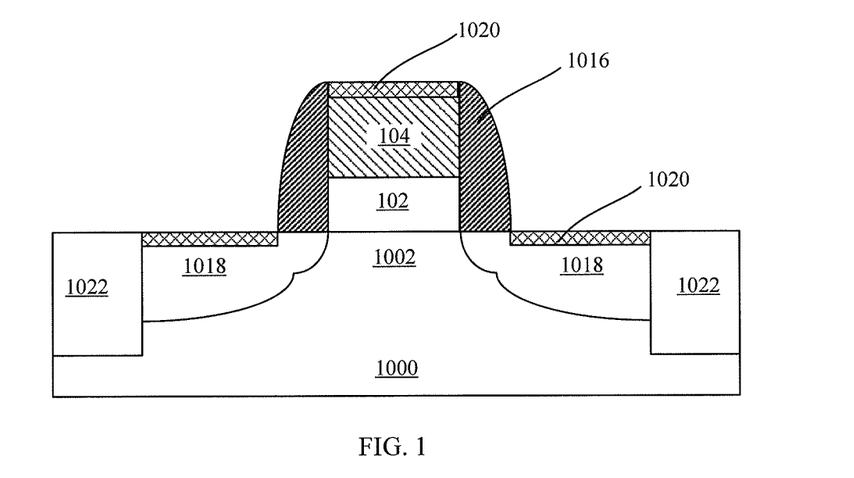
FIGS. 1-4 illustrate structural diagrams for a semiconductor device obtained according to the embodiments of the present invention.

FIG. 1 illustrates a semiconductor device obtained according to an embodiment of the present invention. Wherein, the semiconductor device comprises: a semiconductor substrate 1000; a channel region 1002 positioned in the semiconductor substrate 1000; a gate stack, which is positioned on the channel region 1002, comprising a gate dielectric layer 102 and a gate electrode layer 104, wherein the gate dielectric layer 102 is positioned on the channel region 1002, and the gate electrode 104 is positioned on the gate dielectric layer 102; source/drain regions 1018 positioned at the two sides of the channel region 1002 and embedded into the semiconductor substrate. Wherein, the element Al is distributed in at least one of the upper surface, the bottom surface of the gate dielectric layer 102 and the bottom surface of the gate electrode layer 104.

Preferably, the upper surfaces of the gate electrode layer 104 and the source/drain regions 1018 further comprise a metal silicide 1020. Wherein, the two sides of the device further comprise isolation structures 1022 which, for example, may be shallow trench isolations or other isolation structures.

Preferably, the gate dielectric layer 102 is made from Hf based high k dielectric material which, for example, may comprise one or several of HfAlON, HfSiAlON, HfTaAlON, HfTiAlON, HfON, HfSiON, HfTaON, HfTiON; the gate electrode layer 104 comprises a metal nitride layer containing Al, and is preferably a stack structure of metal nitride/polysilicon; the element Al is distributed in at least one of the upper surface, the bottom surface of the gate dielectric layer 102 and the bottom surface of the gate electrode layer 104.

Figure 2:
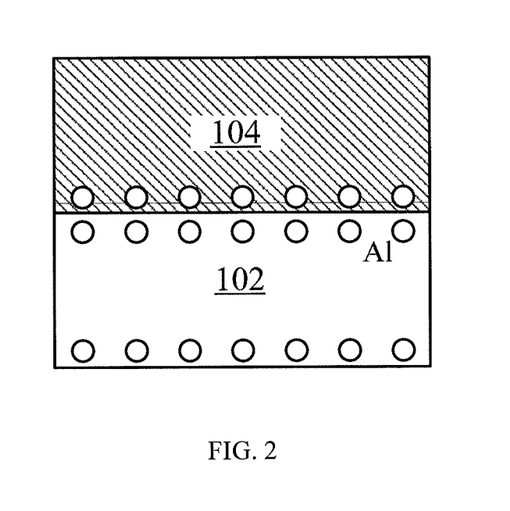

With reference to FIG. 2, an enlarged diagram for the Al distribution is illustrated. Namely, in the preferred embodiments of the present invention, the element Al is distributed in the upper surface, bottom surface and the bottom surface of the gate electrode layer 104, and has formed Al—O electric dipoles.

Figure 3:
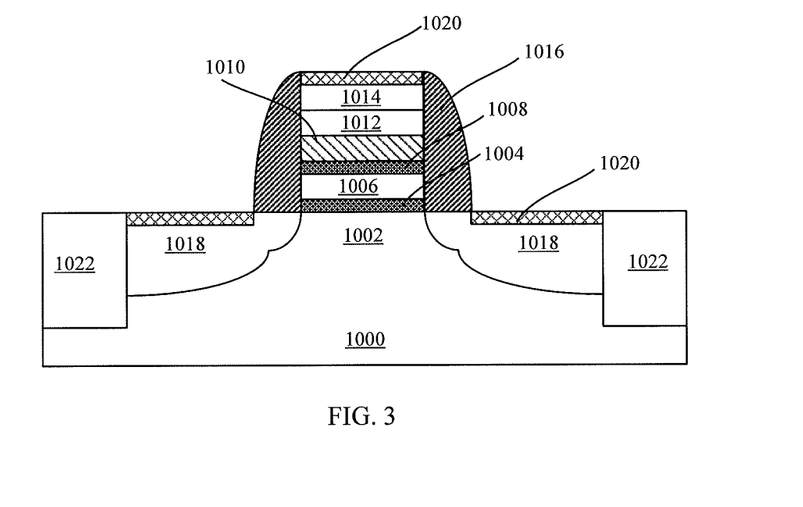
Figure 4:
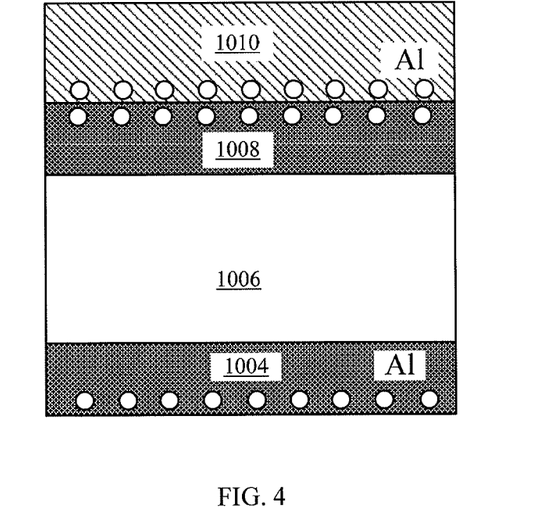

FIG. 3 illustrates a semiconductor device obtained according to another embodiment of the present invention. As compared to the former embodiment, the first difference lies in that the gate dielectric layer 102 therein comprises a second dielectric layer 1004, a first dielectric layer 1006 and a second dielectric layer 1008. The second dielectric layer 1004 and the second dielectric layer 1008 are formed with the same material, which is preferably an oxide or nitride layer containing Al; for example, it may be $AlO_x$ or $AlN_x$ or the like at a thickness of 2-15 Å; the first dielectric layer 1006 is an Hf based high k gate dielectric layer. With reference to FIG. 4, the element Al is distributed at the bottom surface of the second dielectric layer 1004 and the upper surface of the second dielectric layer 1008.

Further preferably in the present embodiment, the gate electrode layer 104 comprises a first metal layer 1010, a second metal layer 1012 and a polysilicon layer 1014. Wherein, the first metal layer 1010 is preferably a metal nitride layer containing Al, which comprises any one or a combination of several of TaAlN, TiAlN, MoAlN, AlN; the second metal layer 1012 is preferably a metal nitride which may comprise any one or a combination of several of TaN, TiN, MoN. Optionally, the second metal layer 1012 may further be Mo, W or their combination.

With reference to FIG. 4, the element Al is further distributed at the bottom surface of the first metal layer 1010.

The semiconductor device in the embodiments of the present invention is p-type MOSFET.

The other embodiments of the present invention may comprise only one of the second dielectric layer 1004 and the second dielectric layer 1008, and they are also able to realize the present invention. In case the gate electrode layer contains Al, the embodiments of the present invention may totally get rid of the second dielectric layer 1004 and the second dielectric layer 1008.

In the embodiment of the present invention, a valence may come into existence between Al and O at the interface of the gate electrode layer and the gate dielectric layer; due to their different electro-negativities, they form Al—O electric dipoles at the interface, thereby causing change to the energy level at the interface, which is shown as the Fermi energy level of the metal gate moves towards the valence band, and thus the gate work function increases, which is therefore favorable for tuning the work function of a metal gate of a p-type metal oxide semiconductor device.

In an embodiment of the present invention, a thin oxide layer (not shown in the Figures) may be further incorporated between the channel region 1002 and the gate dielectric layer 102 or the second dielectric layer 1004, and it is helpful for forming Al—O electric dipoles, and improving the performance of the interface at the meantime.

FIGS. 5 to 9 illustrate in detail the cross-sectional views for the respective steps of the flowchart of manufacturing a semiconductor device according to the embodiments of the present invention. The respective steps according to the embodiments of the present invention are described below in detail along with reference to the drawings.

Figure 5:
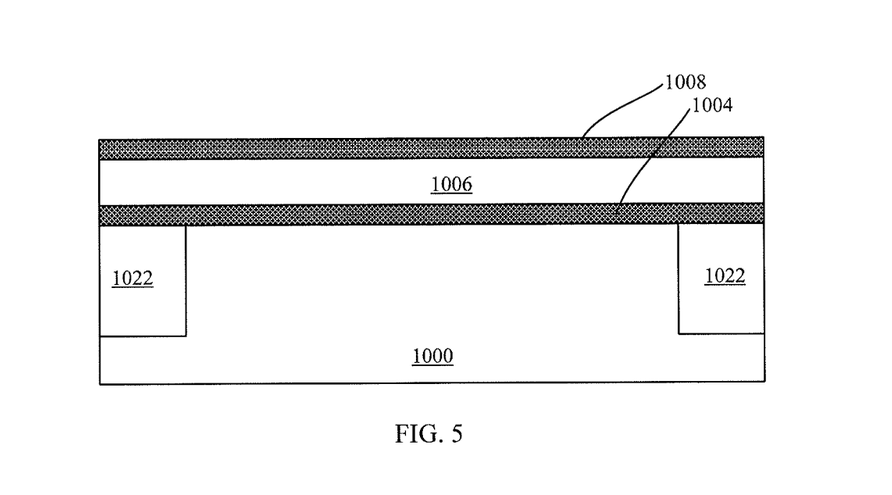
FIGS. 5-9 illustrate the cross-sectional views of the structures corresponding to the respective steps for the flowchart of manufacturing a semiconductor device according to the embodiments of the present invention.

First, as shown in FIG. 5, a semiconductor substrate 1000 is provided. The substrate 1000 may comprise any semiconductor substrate material as appropriate, which may be, but not limited to, Si, Ge, GeSi, SOI (silicon on insulator), SiC, GaAs or any III/V-group compound semiconductors. Additionally, the substrate 1000 may optionally comprise an epitaxial layer, and may be under stress to enhance performance. In the embodiments of the present invention, a Si substrate doped with n-type impurity is preferably used.

Next, an isolation structure is formed on the semiconductor substrate 1000, which is preferably a Shallow Trench Isolation (STI). However, other isolation structures may be used in the embodiments of the present invention; since the isolation structure is not relevant to the gist of the present invention, thus it is not described any further here.

Optionally, an oxide layer (not shown in FIG. 5) may be formed on the semiconductor substrate 1000, which is capable of enhancing the performance of the interface. Specifically, in Nitrogen mixed with a trace of Oxygen, a rapid thermal oxidation is performed to the semiconductor substrate at a temperature of 600-800° C. for 30 to 120 seconds so as to form an oxide layer of 5-8 Å.

Then, a gate dielectric layer is formed on the oxide layer (a gate dielectric layer is formed on the semiconductor substrate, if no oxide layer has been formed). Specifically, a second dielectric layer 1004 is formed at first, and it is preferably an oxide or nitride layer containing Al, which may be, for example, $AlO_x$ or $AlN_x$ or the like; then, a first dielectric layer 1006 is formed on the second dielectric layer 1004; the first dielectric layer 1006 is an Hf based high k gate dielectric layer which, for example, may include any one or a combination of several of HfAlON, HfSiAlON, HfTaAlON, HfTiAlON, HfON, HfSiON, HfTaON, HfTiON; next, a second dielectric layer 1008 is formed on the first dielectric layer 1006, wherein the second dielectric layer 1008 and the second dielectric layer 1004 are formed with the same material. Then, annealing process is performed to the gate dielectric layer in Nitrogen mixed with a trace of Oxygen so as to form a high k gate dielectric layer containing Al; as shown in FIG. 4, the element Al is distributed at the upper surface and the bottom surface of the gate dielectric layer, specifically, at the bottom surface of the second dielectric layer 1004 and the upper surface of the second dielectric layer 1008.

The formation of a gate dielectric layer according to a preferred embodiment of the present invention is described in detail here below. First, an oxide layer is formed on a semiconductor substrate 1000; then, a gate dielectric layer is formed on the oxide layer, and it may be a stack layer comprising $AlN_x$/HfSiON/$AlN_x$; wherein, $AlN_x$ serves as a second dielectric layer and may be fabricated by means of Reactive Magnetron Sputtering process; the atmosphere for sputtering is a mixture of Argon and Nitrogen, the sputtering power is 200-500 W; and the N content in the $AlN_x$ thin film may be tuned by way of tuning the flow volume of Nitrogen; an HfSiON high k thin film, which serves as a first dielectric layer, may be formed by means of Magnetron Sputtering process or Atomic Layer Deposition process. Next, a rapid thermal annealing process is performed to the $AlN_x$/HfSiON/$AlN_x$ stack layer dielectrics in Nitrogen mixed with a trace of Oxygen; the oxygen content therein is preferably 1-10%, the temperature for annealing is preferably 700-1000° C., and the period of time may be 10-50 seconds, such that an HfSiAlON high k gate dielectric thin film that serves as a gate dielectric layer is formed. The element Al is distributed at the upper surface and the bottom surface of the gate dielectric layer, as shown in FIG. 4. Wherein, Al in the second dielectric layer 1004 combines with O in the oxide layer to form Al—O electric dipoles; and Al in the second dielectric layer 1008 combines with O in the surrounding atmosphere to form Al—O electric dipoles.

It is noteworthy that, if the second dielectric layer 1004 is made from $AlN_x$, then it is preferred to form firstly an oxide layer on a semiconductor substrate, because this is more favorable for the later formation of electric dipoles. Of course, if no oxide layer is to be formed, Al—O electric dipoles also can be formed by means of performing an annealing process in Nitrogen mixed with Oxygen after the subsequent formation of stack gate dielectrics.

Figure 6:
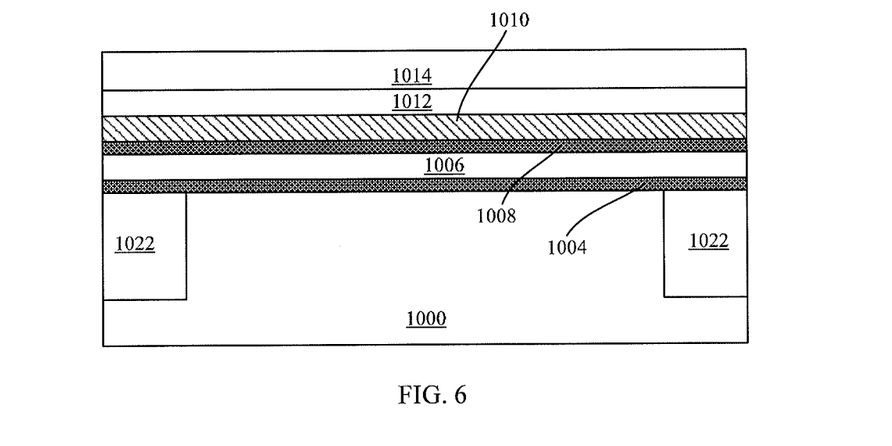

Next, as shown in FIG. 6, a gate electrode layer is continually formed on the gate dielectric layer. Specifically, a first metal layer 1010 and a second metal layer 1012 are firstly formed on the second dielectric layer 1008. Wherein, the first metal layer 1010 is preferably a metal nitride layer containing Al, which comprises any one or a combination of several of TaAlN, TiAlN, MoAlN, $AlN_x$; and the second metal layer 1012 is preferably a metal nitride, which may comprise any one or a combination of several of TaN, TiN, MoN. Optionally, the second metal layer further may be Mo or W or their combination. Then, it is preferred in the embodiments of the present invention to further form a polysilicon (Poly) layer 1014 on the second metal layer.

In the preferred embodiments of the present invention, a stack gate electrode structure of $AlN_x$/TaN/Poly is formed; wherein $AlN_x$ servers as the first metal layer, and TaN serves as the second metal layer. The specific formation method is as below; $AlN_x$/TaN structures are formed by means of Reactive Magnetron Sputtering process in a sputtering atmosphere of mixture of Argon and Nitrogen at a sputtering power of 200-1000 W, under an operation pressure of $(2\text{-}8)\times10^{-3}$ Torr; the Al target is firstly sputtered, and the Ta target is then sputtered, such that $AlN_x$/TaN stack structures are deposited. At last, a polysilicon thin film 1014 of 1000-2000 Å is further deposited on the second metal layer 1012 by means of Low Pressure Chemical Vapor Deposition (LPCVD) process.

Figure 7:
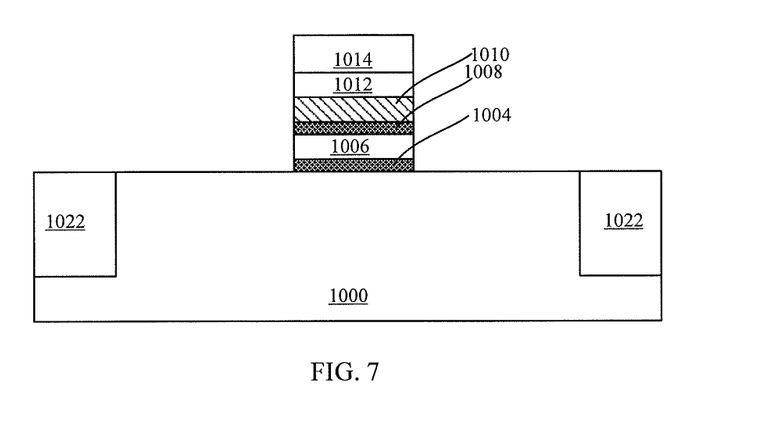

Then, patterned etching is performed to form a gate stack structure. Specifically, photoresist is spin-coated on the polysilicon layer 1014, then the photoresist is patterned according to the pattern of the gate stack to be formed, and then etching is performed with a mask served by the patterned photoresist, so as to form a gate stack structure as shown in FIG. 7.

Here below, source/drain regions of a device are made according to the conventional processes.

First, source/drain extension implant is performed to the overall semiconductor device structure. Since a pMOSFET is desired to be formed, thus B or In ions may be implanted. Optionally, Halo implant is further performed, for example, As or P may be implanted, such that a Halo implant region (not shown in the drawings) is formed in the channel region 1002 under the gate stack or in the substrate 1000 under the channel region 1002.

Figure 8:
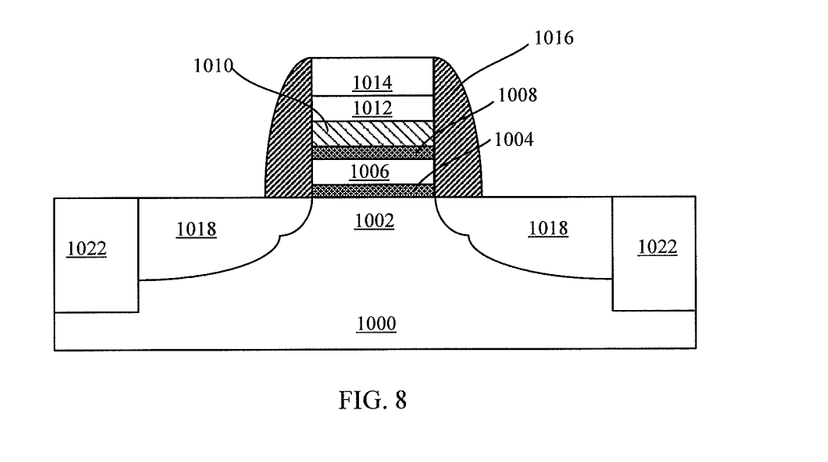

Then, as shown in FIG. 8, sidewall spacers around the gate stack are formed. Specifically, a $Si_3N_4$ layer at a thickness of 500-900 Å may be formed by means of Plasma-Enhanced Chemical Vapor Deposition (PECVD) process, and then dry etching process such as Reactive-Ion Etching (RIE) is applied to out-etch to form $Si_3N_4$ sidewall spacers.

Figure 9:
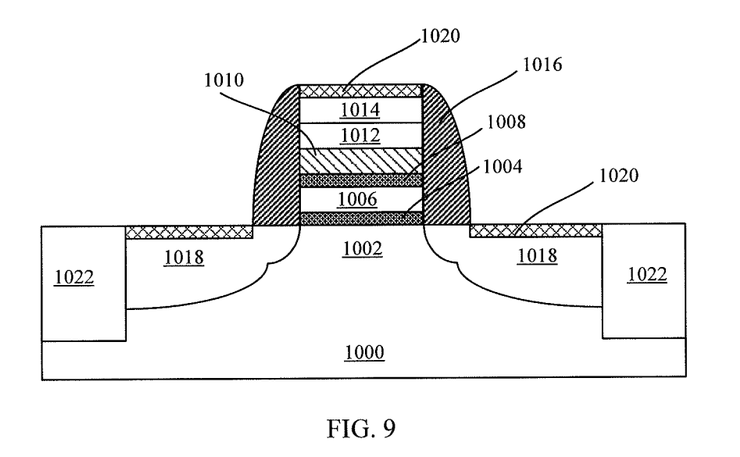

As shown in FIG. 9, source/drain implant is performed, for example, B or In is implanted to form source/drain regions 1018.

Unlike the conventional technology, there is a need to perform annealing after the formation of source/drain regions in order to form Al—O electric dipoles, and the annealing may be performed at a temperature of 800-1200° C., and the annealing may last 3 to 10 seconds. Now, as shown in FIG. 4, a large amount of Al accumulate at the bottom surface of the first metal layer 1010, and Al combines with O atoms in the gate dielectric layer to form Al—O electric dipoles.

As shown in FIG. 9, according to the conventional device formation method, a metal silicide 1020 is formed at the source/drain regions 1018 and at the upper surface of the polysilicon layer 1014. The step of forming the metal silicide 1020 also may precede the foregoing step of annealing.

Finally, according to the conventional device formation method, an interlayer dielectric layer is formed on the overall semiconductor device structure; and a contact to the gate and the source/drain is formed in the interlayer dielectric layer.

In the embodiments of the present invention, Al is introduced into both the gate dielectric layer and the gate electrode, and after the performance of a source/drain activation annealing process, the element Al at the gate electrode and the interface of the high gate dielectric will form a valence with the element O in the gate dielectrics; due to their different electro-negativities, they form Al—O electric dipole at the interface, thereby causing change to the energy level at the interface and thus making the flat-band voltage of the metal gate shift forwards, which is shown that the Fermi energy level of the metal gate moves towards the valence band, and thus the gate work function increases, which is therefore favorable for tuning the work function of a metal gate of a p-type metal oxide semiconductor device. Meanwhile, the Al content at the interface may be increased by increasing the thickness of the oxide or nitride thin film containing Al at the interface, such that more electric dipoles will be formed so as to improve the capacity for tuning work function.

The experiment results show that, when the second dielectric layers ($AlN_x$) 1004, 1008 have a thickness of 2.5 Å, they are able to tune work function of pMOSFET higher by 0.52 eV; when the second dielectric layers ($AlN_x$) 1004, 1008 have a thickness of 5 Å, it is able to tune work function of pMOSFET higher by 0.81 eV; when the first metal layer ($AlN_x$) 1010 has a thickness of 5 Å, it is able to tune work function of pMOSFET higher by 0.36 eV; and when the first metal layer 1010 has a thickness of 12 Å, it is able to tune work function of pMOSFET higher by 0.52 eV.

Additionally, the use of high k gate dielectrics enables it to have a relatively greater physical thickness when maintaining a much smaller equivalent oxide thickness, which thus is favorable for decreasing the leakage current at the gate dielectrics; the use of metal gate enables to solve such problems as polysilicon depletion effect and grave increment of gate resistance which take place along with the scaling of critical dimension of the small-sized devices.

As noted from the foregoing disclosure, although the technical details for such as composition, etching of the respective layers are not given specifically, a person of ordinary skill in the art should understand that it is also applicable for forming layers and regions in desired shapes by the various means in the prior art. Besides, in order to form the same structure, a person of ordinary skill in the art may further design a method which is not necessarily same as the method described above.

The present invention is described above with reference to its embodiments. However, these embodiments are merely illustrative thus should not be interpreted as a limit to the present invention. The scope of the present invention is defined by the appended claims and their counterparts. It is readily apparent to those having ordinary skill in the art that various substitutions and amendments may be made to the embodiments without departing from the spirit and principles of the present invention, and these substitutions and amendments should fall into the scope of the present invention.

What is claimed is:

1. A p-type semiconductor device, comprising:
   a semiconductor substrate;
   a channel region positioned in the semiconductor substrate;
   a gate stack, which is positioned on the channel region, comprising a gate dielectric layer and a gate electrode layer; wherein the gate dielectric layer is positioned on the channel region, and the gate electrode layer is positioned on the gate dielectric layer; and
   source/drain regions positioned at the two sides of the channel region and embedded into the semiconductor substrate;
   wherein the gate dielectric layer comprises a first dielectric layer and at least two second dielectric layers, the first dielectric layer being sandwiched between said two second dielectric layers, and
   the first dielectric layer is a high k gate dielectric layer, and the second dielectric layers are oxide or nitride layers containing Al and are positioned above and below the first dielectric layer as upper and lower second dielectric layers, respectively, the element Al being distributed at an upper surface of the upper second dielectric layer and a bottom surface of the lower second dielectric layer.

2. The semiconductor device according to claim 1, wherein the thickness of the second dielectric layers are 2-15 Å.

3. The semiconductor device according to claim 1, wherein the element Al is distributed in any one of the surfaces in the form of Al—O electric dipoles.

4. The semiconductor device according to claim 1, wherein an oxide layer is further incorporated between the gate dielectric layer and the semiconductor substrate.

5. The semiconductor device according to claim 1, wherein the second dielectric layers are $AlO_x$ or $AlN_x$.

6. The semiconductor device according to claim 1, wherein the high k gate dielectric layer contains Al.

7. The semiconductor device according to claim 6, wherein the high k gate dielectric layer comprises: any one or a combination of several of HfAlON, HfSiAlON, HfTaAlON, HfTiAlON, HfON, HfSiON, HfTaON, and HfTiON.

8. The semiconductor device according to claim 1, wherein the gate electrode layer comprises a first metal layer, which is a metal nitride layer containing Al.

9. The semiconductor device according to claim 8, wherein the first metal layer comprises: any one or a combination of several of TaAlN, TiAlN, MoAlN and AlN.

10. The semiconductor device according to claim 8, wherein the gate electrode layer further comprises a second metal layer positioned on the first metal layer.

11. The semiconductor device according to claim 10, wherein the second metal layer comprises Mo, W or the combination thereof.

12. The semiconductor device according to claim 10, wherein the second metal layer comprises metal nitride.

13. The semiconductor device according to claim 12, wherein the metal nitride comprises: any one or a combination of several of TaN, TiN and MoN.

\* \* \* \* \*